US007523150B2

(12) United States Patent
de Brebisson

(10) Patent No.: US 7,523,150 B2
(45) Date of Patent: Apr. 21, 2009

(54) BINARY REPRESENTATION OF NUMBER BASED ON PROCESSOR WORD SIZE

(75) Inventor: Cyrille de Brebisson, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 834 days.

(21) Appl. No.: 10/974,689

(22) Filed: Oct. 28, 2004

(65) Prior Publication Data

US 2006/0095487 A1    May 4, 2006

(51) Int. Cl.
*G06F 7/00* (2006.01)
(52) U.S. Cl. ..................................... 708/204
(58) Field of Classification Search ............. 708/204
See application file for complete search history.

(56) References Cited

U.S. PATENT DOCUMENTS 6,166,664 A * 12/2000 Acharya ..................... 341/63
2002/0184282 A1* 12/2002 Yuval et al. ................. 708/495

OTHER PUBLICATIONS

Peter Hemsley; "High-Speed Decimal to Binary for Pics"; Everyday Practical Electronics; Dec. 2003, pp. 887-888.

Mike Cowlishaw; "REXX Arithmetic—more than just a number"; URL:http://web.archive.org/web/20041023215445/http://rexxla.org/Symposium/2001/mike/rexxsy01.pdf; pp. 28-29.
Mike Cowlishaw; "Densely Packet Decimal Encoding"; IEE Proceedings E. Computers & Digital Techniques, Institution of Electrical Engineers, vol. 149, No. 3, May 24, 2002.
Takasi, Y.; "Floating Point Number Format with Number System with Base of 1000"; IBM Technical Disclosure Bulletin; vol. 41, No. 1, Jan. 1998, pp. 609-610.
Chen et al., "Storage-Efficient Representation of Decimal Data"; Communications of the ASM USA, vol. 18, No. 1, Jan. 1975; pp. 49-52.
Gilbert et al.; Introduction to Saturn Assembly Language; URL:http://web.archive.org/web/20040414221018/http://www.exzodia.net/hp48/docs/asmtut.pdf; chapters 12-14.

* cited by examiner

*Primary Examiner*—Tan V Mai

(57) ABSTRACT

A method of converting a number to a binary representation based on a processor word size is described. In accordance with the method, a predetermined size segment of a number is converted to a binary representation wherein the predetermined size segment is based on the processor word size. Also described is a method of converting a number represented in binary form and comprised of more than one segment, wherein the segment size is determined based on processor word size, to a decimal representation. A first decimal segment resulting from converting a segment of the more than one binary segments to decimal form is combined with a second decimal segment resulting from converting another segment of the more than one binary segments to decimal form.

12 Claims, 1 Drawing Sheet

BINARY REPRESENTATION OF NUMBER BASED ON PROCESSOR WORD SIZE

FIELD OF THE INVENTION

The present invention relates to representing a number in binary form based on processor word size.

BACKGROUND

A processor, e.g., a microprocessor, central processing unit (CPU), etc., controls the operation of many devices, e.g., calculators, computer systems, cellular phones, etc. Processors vary in many ways, e.g., instruction set, word size, and clock speed, etc. Processor word size specifies the number of bits of data a processor is able to store in a processor storage location, i.e., a data register, at one time. For example, early processors used in personal computers had word sizes of 8 bits, i.e., the processors were able to store 8 bits of data at a time. Similarly, more recent 16, 32, and 64 bit processors are able to store 16, 32, and 64 bits of data at a time, respectively.

Processors operate on data in binary form, i.e., ones and zeroes arranged to specify numbers based on powers of two. In order for a processor to operate on a number, the processor converts the number to a binary representation. It is known in the art to encode decimal numbers into a binary representation. For example, the decimal numbers 5 and 235 can be represented using the binary values 0101 and 1110 1011, respectively. However, encoding a decimal number to a binary representation requires a certain amount of processing time in terms of processor operations needed to convert the number from one form to the other. Therefore, alternate encoding techniques have been applied to minimize the amount of processing required for the decimal to binary encoding and decoding.

Further, the number value may increase beyond the storage capability of a single processor word, e.g., the number 256 requires 9 binary digits for representation and uses two words of an 8 bit processor for storage and operation thereon.

One basic alteration of this encoding is binary coded decimal (BCD) in which four binary digits are used to encode each digit of a decimal number. With respect to the previous example, the decimal numbers 5 and 235 are represented as the binary values 0101 and 0010 0011 0101, respectively. Thus, instead of requiring 3 and 8 binary digits as described above, the BCD approach requires 3 and 10 binary digits to represent the same two numbers. Using the BCD approach, each digit is represented by a corresponding four binary digits as depicted in Table 1:

TABLE 1

|  | decimal | | | |
| --- | --- | --- | --- | --- |
|  | 5 | 2 | 3 | 5 |
| binary (BCD) | 0101 | 0010 | 0011 | 0101 |

Additional encoding methods seek to increase storage efficiency by encoding more decimal digits in a given number of binary digits, e.g., the Chen-Ho algorithm encodes three decimal digits into a corresponding 10 binary digits reaches a 99.66% storage efficiency. Increased storage efficiency through the use of complicated encoding algorithms comes at the expense of additional complexity, e.g., in terms of processing cost, i.e., additional processing time and/or specialized hardware.

SUMMARY

The present invention provides a method for representing a number in binary form based on processor word size.

A method aspect includes converting a number to a binary representation is described. In accordance with the method, a predetermined size segment of a number is converted to a binary representation wherein the predetermined size segment is based on the processor word size.

A further method aspect includes converting a number represented in binary form and comprised of more than one segment, wherein the segment size is determined based on processor word size, to a decimal representation. A first decimal segment resulting from converting a segment of the more than one binary segments to decimal form is combined with a second decimal segment resulting from converting another segment of the more than one binary segments to decimal form.

A further method aspect includes converting a number having a number of digits to a binary representation using a processor having a predetermined word size of a predetermined number of bits. The maximum number of digits storable in one word of the predetermined word size is determined. A determined maximum storable number of digits of the number are converted to a binary representation in a first word.

A computer-readable medium for representing a number in binary form based on processor word size includes more than one segment representing more than one digit of a number in binary form wherein the segment size is determined based on processor word size.

Still other advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention.

DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION

Figure 1:
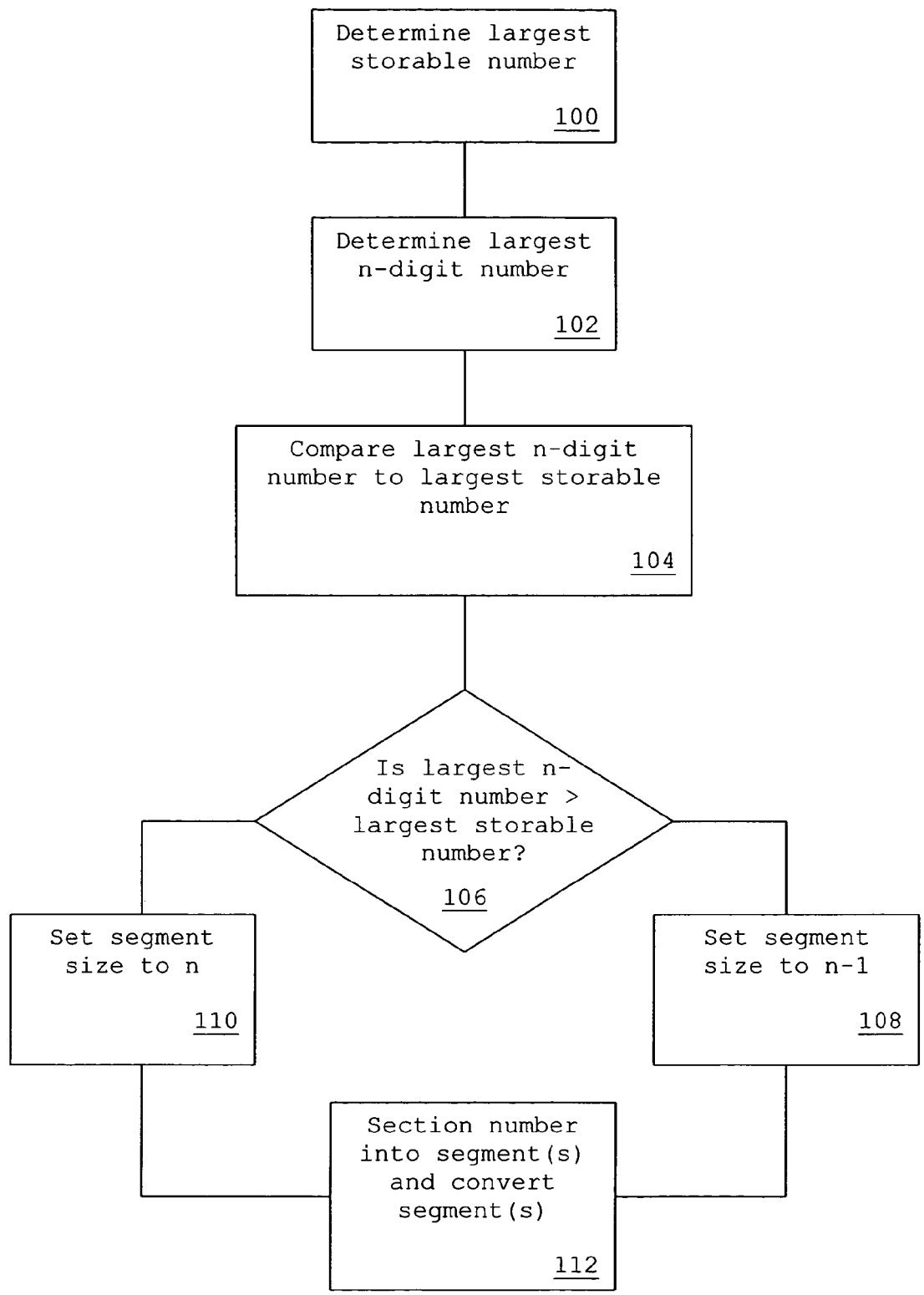
FIG. 1 is a high level flow of control of an embodiment according to the present invention.

In contrast with the above-described approaches, the mechanism of the present invention represents a number in binary form based on processor word size.

Similar to an alphabet where a set range of possible symbols are used in differing numbers and combinations to represent many different words, different numbering systems include a range of possible individual digits used to represent different values. For example, the range of digits in the decimal number system is 0-9. Any decimal number is represented using one or a combination of one or more individual digits of the numbers 0-9 in conjunction with units of ten depending on the position of the digit. That is, the number 256 represents: $2*10^2+5*10^1+6*10^0$. Similarly, the range of digits in the hexadecimal number system is 0-F corresponding to the values 0-15, the digits of members in the octal number system is 0-7, etc. In alternate embodiments, different numbering systems may be used; however, for simplicity and clarity only a decimal number system is described below.

One embodiment according to the present invention converts a number into a binary representation by determining the maximum number of digits which a given processor word size is able to store where each digit must be able to take on any of the range of digits and segmenting the number into sections of a length equal to the maximum number of digits. In one embodiment, the number to be converted is a decimal number; however, alternate embodiments may convert different number system numbers employing similar methods described below. For clarity and simplicity, a decimal number is used herein.

Each digit position of a maximum decimal number must be able to take on the maximum value of the range of numbers in the number system. That is, for an 8 bit word size, the maximum decimal number able to be stored is 255, thus the number of possible digits storable in the word size is three; however, the first digit (leading digit) value is restricted to being within the range of 0-2 in order to remain within the word size. The second and third digit values are not so restricted and may take on any value within the range of decimal digits, i.e., any of the values 0-9 may be positioned in the second and third digits (to the right of the first digit) without exceeding the word size in a binary representation.

In order to convert a decimal number to a binary number based on word size according to one embodiment, a segment size based on the processor word size is determined. FIG. 1 depicts a flow of control for execution by a processor of a process according to one embodiment of the present invention. Given a particular processor word size, the processor executing instructions according to the flow of control of FIG. 1 at step 100 determines the largest decimal number able to be stored in binary representation in the given word size, e.g., for an 8 bit processor the largest storable number is 255. The flow of control proceeds to step 102 where the largest decimal number having a digit length equal to the number of digits of the largest storable decimal number is determined, i.e., the largest n-digit decimal number. For example, 999 is the largest three digit decimal number.

The flow of control proceeds to step 104 and the processor compares the largest n-digit decimal number to the largest storable number. At step 106, if the largest n-digit decimal number is greater than the largest storable number, then the flow of control proceeds to step 108 and the segment size used to section the decimal number is set to one less than the number of digits of the largest storable decimal number, i.e., n−1. If the largest n-digit decimal number is less than or equal to the largest storable number, then the flow of control proceeds to step 110 and the segment size used to section the decimal number is set to the number of digits of the largest storable decimal number, i.e., n. For the above example, the number 999 is greater than the number 255 and the segment size is set to two, i.e., n−1, 3−1=2. That is, each decimal number is sectioned into one or more segments having no more than two digits per segment.

After determining the segment size in either of steps 108 and 110, the flow of control proceeds to step 112 and the processor sections a number, e.g., a decimal number to be stored in a binary form, into a number of segments based on the above-determined segment size, i.e., number of digits to be stored in the given processor word size.

The segment size determines the number of digits to be represented in binary form in each given processor word size. Depending on the number of digits of a particular decimal number, multiple segments may be required to represent the entire decimal number. The number of digits of the number to be stored determines the number of segments required, e.g., the rounded result of dividing the number of digits of the number to be stored by the segment size. In the foregoing example, the number of digits of the number to be stored is 3 and the segment size is 2 and so the number of segments required to store the number is two, i.e., 3/2=1.5 rounded to 2.

Based on the foregoing example, an 8 bit processor word size requires sectioning of a decimal number into two digit segments. For example, the number 763 is stored using two segments: a first segment storing the decimal number 7 in binary form and a second segment storing the decimal number 63 in binary form. Table 2 depicts the decimal and segmented binary representation of the number 763:

TABLE 2

|  | decimal | |
| --- | --- | --- |
|  | 7 | 63 |
| segmented binary | 0000 0111 | 0011 1111 |

In another example, the number 635,664 is six digits long and is stored using three segments: a first segment storing the decimal number 63 in binary form, a second segment storing the decimal number 56 in binary form, and a third segment storing the decimal number 64 in binary form. Table 3 depicts the decimal and segmented binary representation of the number 635,664.

TABLE 3

|  | decimal | | |
| --- | --- | --- | --- |
|  | 63 | 56 | 64 |
| segmented binary | 0011 1111 | 0011 1000 | 0100 0000 |

Assuming a given processor word size of 8 bits, the maximum decimal value able to be stored is 255, i.e., a range of 256 values from 0-255 may be stored using combinations of zeroes and ones in an 8 digit arrangement.

A clarifying example is now described. Assuming a processor word size of 8 bits, the maximum number able to be stored in binary form in 8 bits is 255, i.e., 1111 1111 in binary form. The range of numbers possible to be stored in a given 8 bit word is from 0 to 255. However, the maximum number of digits storable in 8 bits where each digit must be able to be all of the entire range of possible numbers, i.e., from 0-9, is two, i.e., the range of numbers is from 0 to 99.

Stated another way, all two digit decimal numbers, including decimal numbers having a single digit, can be stored in the 8 bit word size; however, all three digit decimal numbers cannot be stored in the same 8 bit word size. For example, any three digit decimal number wherein the leading digit is greater than two ("2") cannot be stored in binary form in an 8 bit word. Thus, the maximum number of digits able to be stored in an 8 bit word size is two.

A second clarifying example is now described assuming a processor word size of 16 bits. The maximum number able to be stored in binary form in 16 bits is 65,535, i.e., 1111 1111 1111 1111 in binary form. The range of numbers possible to be stored in a given 16 bit word is from 0 to 65,535. However, the maximum number of digits storable in 16 bits where each digit must be able to be all of the entire range of possible numbers is four, i.e., the range of numbers is from 0 to 9999. Because 99,999 is greater than 65,535, the maximum number of usable digits is n−1, 4.

Stated another way, all four digit decimal numbers, including decimal numbers having less than four digits, can be stored in the 16 bit word size; however, all decimal numbers having greater than four digits cannot be stored in the same 16 bit word size. Thus, the maximum number of digits able to be stored in a 16 bit word size is four.

A third clarifying example is now described assuming a processor word size of 32 bits. The maximum number able to be stored in binary form in 32 bits is 4,294,967,295, i.e., 1111 1111 1111 1111 1111 1111 1111 1111 in binary form. The range of numbers possible to be stored in a given 32 bit word is from 0 to 4,294,967,295. However, the maximum number of digits able to be stored in 32 bits where each digit must be able to be all of the entire range of possible numbers is nine, i.e., the range of numbers is from 0 to 999,999,999.

Stated another way, all nine digit decimal numbers, including decimal numbers having less than nine digits, can be stored in the 32 bit word size; however, all decimal numbers having greater than nine digits cannot be stored in the same 32 bit word size. Thus, the maximum number of digits able to be stored in a 32 bit word size is nine.

Numbers stored according to the above-described method are able to be operated upon using the same mathematic operations, i.e., addition, subtraction, multiplication, division, etc., as numbers stored using a straight binary conversion. If a number is stored in more than a single segment, there may be an additional carry to be kept track of and applied to another segment-based operation. Because additional conversion operations, e.g., bitwise value shifting, etc., are not necessary, mathematic operations are able to be performed more quickly than in a binary coded decimal approach.

The storage efficiency of the above-described method is better than using a binary coded decimal (BCD) approach for larger processor word sizes. That is, the storage efficiency is determined by comparing the maximum number of bits used by the given storage method with the maximum number of bits used in the binary representation. For example, using a 16 bit word size, the maximum number of numbers storable is 10,000, i.e., the range from 0-9,999. The storage efficiency is $\log_2 10,000/16$ bits=83.05%. For larger processor word sizes, the storage efficiency improves in comparison with a BCD approach. For example, using a 32 bit word size, the maximum number of numbers storable is 1,000,000,000, i.e., the range from 0-999,999,999. The storage efficiency is $\log_2 1,000,000,000/32$ bits=93.43%. However, the corresponding storage efficiency for a BCD approach is $\log_2 100,000,000/32$ bits=83.05%. Similarly, for a 64 bit word size, the maximum number of numbers storable is 10,000,000,000,000,000,000, i.e., the range from 0-9,999,999,999,999,999,999. The storage efficiency is $\log_2 10,000,000,000,000,000,000/64$ bits=98.62%. However, the corresponding storage efficiency for a BCD approach is $\log_2 10,000,000,000,000,000/64$ bits=83.05%.

For large numbers, the time required to convert a decimal number to a binary number using the above-described approach is less than required for converting a single large number from decimal representation to binary representation. Because the number is converted in segments, a single large number need not be converted all at one time using multiple steps. Further, because the maximum number represented by a segment always fits within the processor word size, the processor converts the segment number to binary representation in a single step. Otherwise, a multi-step process involving storing intermediate results to registers is required for numbers larger than the processor word size.

Similar reasons apply for the conversion from binary to decimal. Decoding the segmented binary number to a decimal number is quicker in comparison to decoding the decimal number stored as a single multi-word binary value. With respect to decoding a multi-word binary value, either the entire binary number must be constructed and then converted into a decimal number necessitating multiple addition and multiplication operations or each word-sized segment of the binary number must be decoded, multiplied by $2^n$, where n is based on the number of binary digits in the word size, and added to any previously decoded segment. In contrast, according to one embodiment, individual binary segments are decoded, typically in a single operation due to the fact that the segments are only as large as the processor word size, and concatenated to form the decimal number.

Additionally, particular portions of a given number may be easily decoded, e.g., the right-most 15 digits of a 45 digit decimal number stored in a 32 bit processor word size system are easily retrieved by obtaining and decoding 2 segments, i.e., 2 words, worth of binary data. This is because with a 32 bit word size, the maximum number of storable digits is 9, i.e., as described above each segment is able to represent up to 9 digits worth of a decimal number.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A method of operating a processor having a processor word size, the method comprising:
   sectioning, with the processor, a given non-binary number system number into one or more segments, wherein each of the one or more segments has a predetermined segment size of one or more digits equal to a maximum number of digits storable in one word having the processor word size, wherein each digit is able to represent all of the range of possible digits of the given non-binary number system;
   converting, with the processor, the segmented given non-binary number system number to a segmented binary representation of the number comprising:
      converting each segment of the one or more segments of the given non-binary number system number to a corresponding binary representation of the segment.

2. The method of claim 1, further comprising:
   setting the segment size to a number of digits of a largest number of the given non-binary number system having a given number of digits, if the largest number of the given non-binary number system having the given number of digits is greater than a largest storable number of the given non-binary number system storable in one word having the processor word size.

3. The method of claim 1, further comprising:
   setting the segment size to one less than a number of digits of a largest number of the given non-binary number system having a given number of digits, if the largest number of the given non-binary number system having the given number of digits is less than or equal to a largest storable number of the given non-binary number system storable in one word having the processor word size.

4. The method of claim 1, wherein the segmented binary representation of the number is larger than one word having the processor word size.

5. A method of operating a processor having a processor word size, the method comprising:
- converting, with the processor, a number having one or more digits to a binary representation, comprising:
  - determining a maximum number of digits storable in one word having the processor word size; and
  - converting the determined maximum storable number of digits of the number to a binary representation in a first word.

6. The method of claim 5, further comprising:
- converting a determined maximum storable number of digits of the number less the previously converted digits to a binary representation in a second word.

7. The method of claim 5, further comprising:
- repeating the converting for a determined maximum storable number of digits of the number less all previously converted digits to a binary representation in an additional word.

8. The method of claim 5, wherein the number in binary form is larger than, one word having the processor word size.

9. A computer-readable storage medium storing instructions for controlling a processor having a processor word size to perform a method comprising:
- sectioning, with the processor, a given non-binary number system number into one or more segments, wherein each of the one or more segments has a predetermined segment size of one or more digits equal to a maximum number of digits storable in one word having the processor word size, wherein each digit is able to represent all of the range of possible digits of the given non-binary number system;
- converting, with the processor, the segmented given non-binary number system number to a segmented binary representation of the number comprising:
  - converting each segment of the one or more segments of the given non-binary number system number to a corresponding binary representation of the segment.

10. The computer-readable storage medium of claim 9, wherein the method comprises:
- setting the segment size to a number of digits of a largest number of the given non-binary number system having a given number of digits, if the largest number of the given non-binary number system having the given number of digits is greater than a largest storable number of the given non-binary number system storable in one word having the processor word size.

11. The computer-readable storage medium of claim 9, wherein the method comprises:
- setting the segment size to one less than a number of digits of a largest number of the given non-binary number system having a given number of digits, if the largest number of the given non-binary number system having the given number of digits is less than or equal to a largest storable number of the given non-binary number system storable in one word having the processor word size.

12. The computer-readable storage medium of claim 9, wherein the segmented binary representation of the number is larger than one word having the processor word size.

* * * * *

UNITED STATES PATENT AND TRADEMARK OFFICE
CERTIFICATE OF CORRECTION

PATENT NO. : 7,523,150 B2  Page 1 of 1
APPLICATION NO. : 10/974689
DATED : April 21, 2009
INVENTOR(S) : Cyrille de Brebisson It is certified that error appears in the above-identified patent and that said Letters Patent is hereby corrected as shown below:

In column 7, line 26, in Claim 8, delete "than," and insert -- than --, therefor.

Signed and Sealed this

Tenth Day of November, 2009

David J. Kappos
*Director of the United States Patent and Trademark Office*